United States Patent [19]

DeRoo, Sr.

[11] 3,982,743

[45] Sept. 28, 1976

[54] METHOD OF MANUFACTURING BOOKS

[76] Inventor: Paul W. DeRoo, Sr., 1540 N. State Parkway, Chicago, Ill. 60610

[22] Filed: Dec. 9, 1974

[21] Appl. No.: 530,517

[52] U.S. Cl. ................................................. 270/1
[51] Int. Cl.² ...................................... B41F 13/54
[58] Field of Search .................... 270/1, 4, 22, 1 R; 101/395, 401.1, 407 R, 407 BP, 426, 220, 221, 415.1, DIG. 12; 96/1 PE, 41; 33/1 G, 184.5

[56] References Cited
UNITED STATES PATENTS

| | | | |
|---|---|---|---|
| 1,999,616 | 4/1935 | Peterson | 96/41 |
| 2,463,769 | 3/1949 | Higgins | 270/4 |
| 2,871,572 | 2/1959 | Gutzmer | 33/184.5 |
| 3,048,099 | 8/1962 | Davidson | 101/233 |
| 3,154,012 | 10/1964 | Fischer | 101/415.1 |

OTHER PUBLICATIONS

"Bookbinding" by Blaine, p. 3.
"Photomechanics and Printing" by Mertle, 1957, Mertle Publishing Co., pp. 72–73.

Primary Examiner—Robert W. Michell
Assistant Examiner—V. Millin
Attorney, Agent, or Firm—Hume, Clement, Brinks, Willian, Olds & Cook, Ltd.

[57] ABSTRACT

A method of manufacturing books wherein a sequence of eight pages of proofs for printing or book pages for reprinting are selected. Four of the pages are arranged in a predetermined manner on a direct image, positive plate-making machine wherein said plate making machine includes a work holder or jig in the shape of a cross and thusly a plate is made therefrom. A plate is then made in the same manner with the remaining four pages. Each plate is positioned on a drum segment of a perfecting press with center registration marks put on the plates according to the invention in vertical alignment. The press prints sheets containing the eight pages on opposite sides, after which two folds are made in the sheet pursuant to the method of the invention, the folded sheet is collated with other eight page segments of the book made in the same manner, the books assembled, bound and trimmed.

6 Claims, 11 Drawing Figures

FIG. 1
FIG. 2
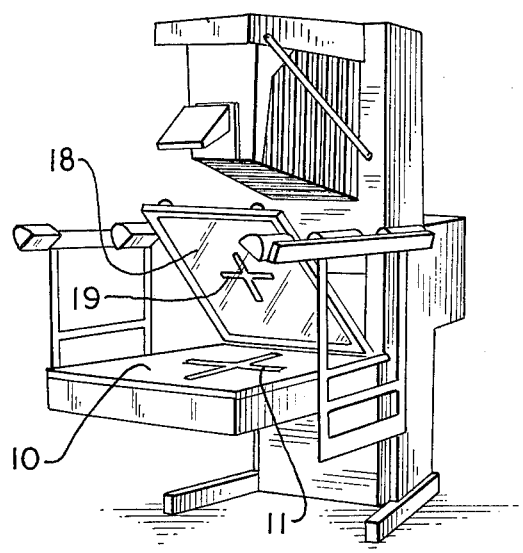
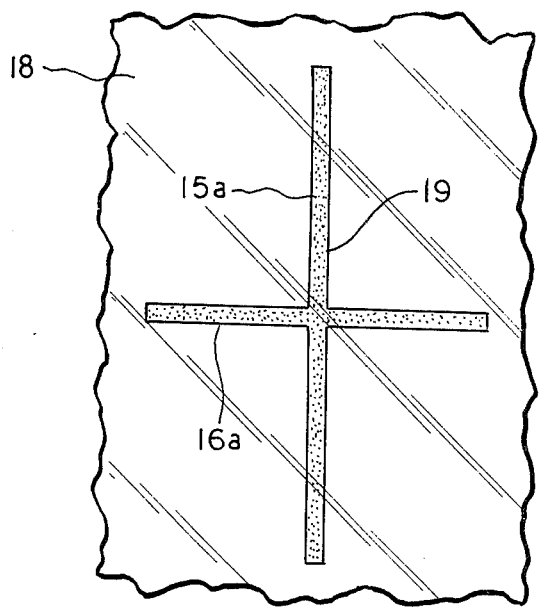
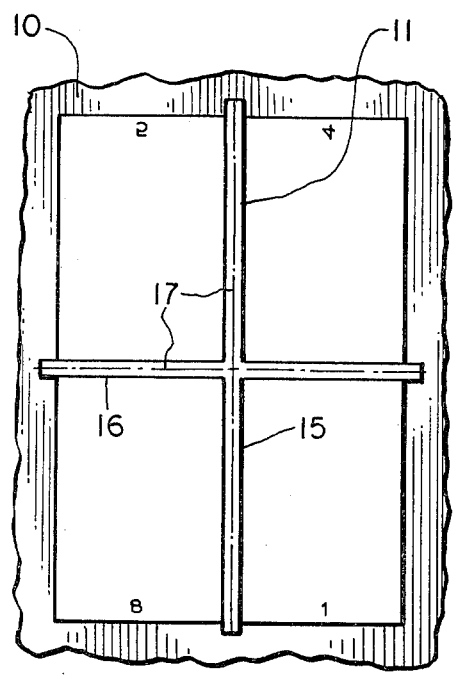
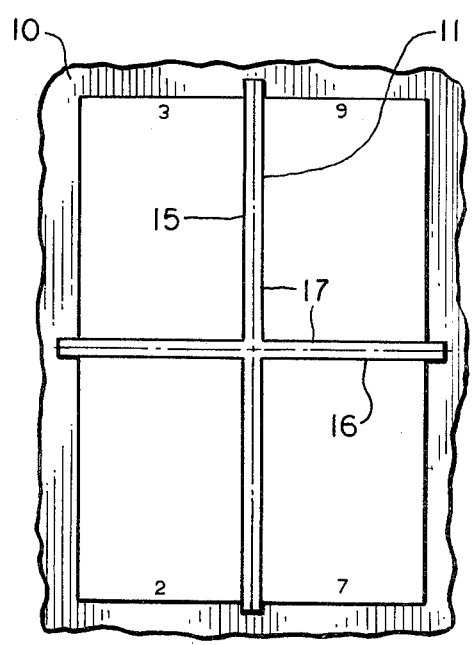
FIG. 3
FIG. 4

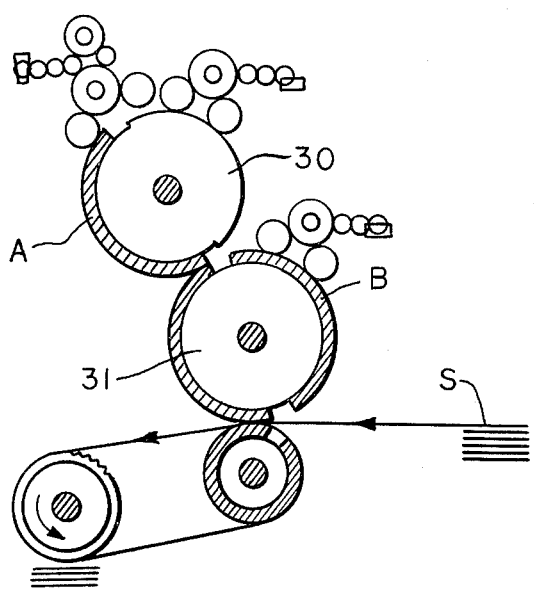
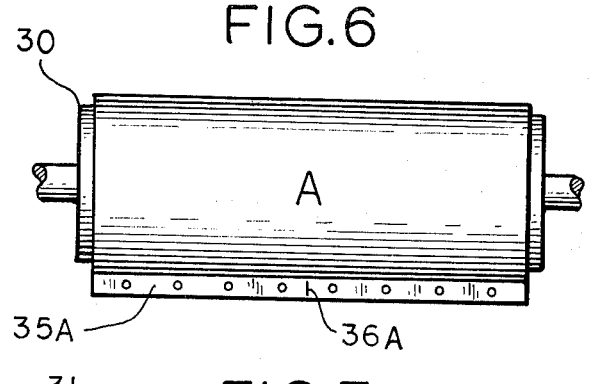
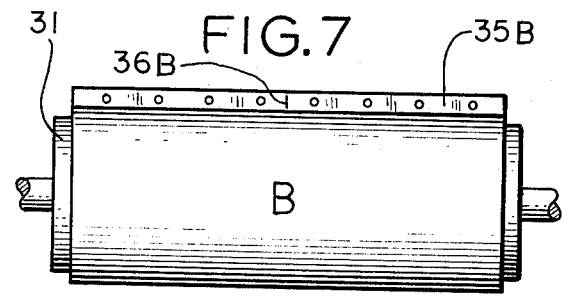
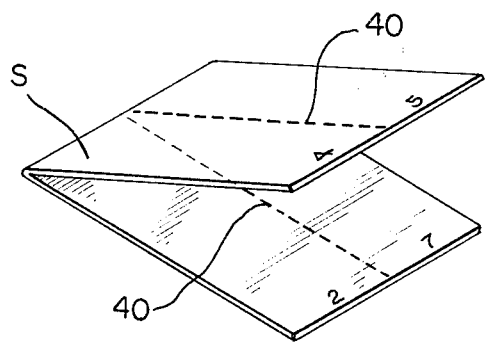
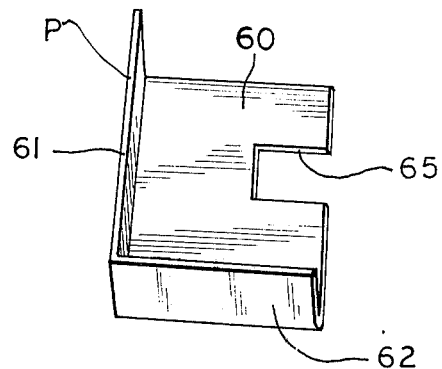
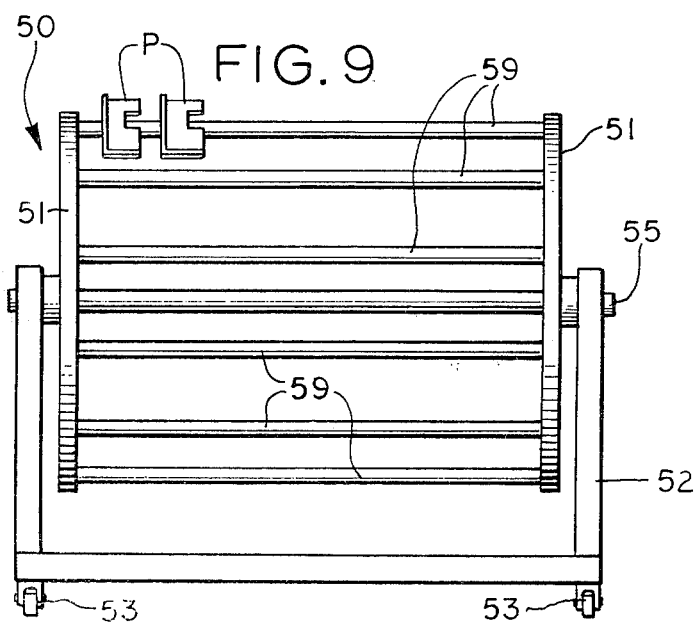
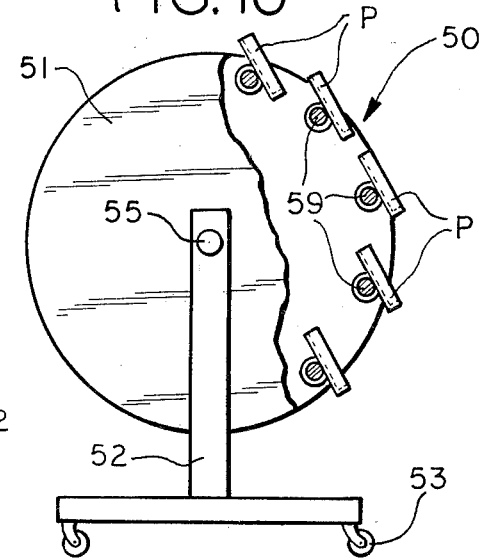

METHOD OF MANUFACTURING BOOKS

FIELD OF THE INVENTION

This invention is in the field of book printing and binding. It relates particularly to a method of manufacturing books, including printing and binding.

BACKGROUND OF THE INVENTION

The conventional method of printing and binding books involves the use of offset printing followed by one of several conventional binding methods. In offset printing, negatives are conventionally made from page proofs, for example, with an offset camera. The negatives are then stripped into a predetermined layout and an offset plate is made from the negatives.

The plate is mounted on an offset press. The offset press is utilized to print a desired quantity of pages. Each sheet, containing 32 pages in most instances, is then folded in a conventional manner and bound.

Preliminary preparation and set-up time necessary to using this conventional method of printing and binding books is quite high, resulting in an unacceptably high unit cost to produce a small quantity of books; i.e., a run of less than one thousand (1,000) books. Accordingly, it is virtually impossible for publishers or authors to publish certain technical books which are desired in relatively small numbers. Furthermore, the so-called "vanity" printing business is virtually non-existent in the United States because authors who desire to publish a limited number of copies of their own works, with the author paying the printing and binding costs, cannot afford the high costs inherent in conventional methods.

THE INVENTION

The present invention is embodied in a method of producing short-run books at a cost of twenty-five to fifty percent (25–50%) of the cost of producing books by conventional methods. The method utilizes equipment which is, in total, substantially less expensive than that conventionally employed. It employs only three persons to perform most efficiently. It produces a finished book which is of as high quality as those produced by conventional methods.

BRIEF DESCRIPTION OF THE DRAWINGS

The method embodying features of the invention, including additional objects and advantages thereof, is illustrated more or less diagrammatically in the drawings, in which:

FIG. 1 is a perspective view of the flat bed surface of a direct-image, positive plate-making machine modified according to the present invention;

FIG. 2 is a front elevational view of the glass cover for the bed illustrated in FIG. 1, with the glass raised and shown modified according to the present invention;

FIG. 3 is a top plan view of th plate machine bed illustrating the step of positioning pages 1, 4, 5 and 8 for the plate-making process;

FIG. 4 is a view similar to FIG. 3, illustrating the step of positioning pages 2, 3, 6 and 7 for plate-making according to the invention;

FIG. 5 is a diagrammatic view of the cooperating drums and ink rollers in a perfecting press utilized in the present invention;

FIG. 6 is a front elevational view of the upper plate-receiving drum seen in FIG. 5, as adapted to receive a plate and modified according to the present invention;

FIG. 7 is a front elevational view of the lower plate-receiving drum modified according to the present invention and about to receive the other plate;

FIG. 8 is a diagrammatic view of a printed sheet comprising eight pages of the book being printed, after a first fold in the method of the invention;

FIG. 9 is a front elevational view of a rack for assembling books according to the method of the invention;

FIG. 10 is an end view of the rack illustrated in FIG. 9; and

FIG. 11 is an enlarged front elevational view of one of the book pockets on the rack illustrated in FIGS. 9 and 10.

DESCRIPTION OF THE PREFERRED EMBODIMENT

The first step in the method is to take the first eight page proofs for a new book, and trim them. The pages are trimmed to specific head margins and gutter margins. In the present illustration, these margins are each ½ inch but they might be varied according to the invention. Furthermore, although the method is discussed in terms of preparing or printing a book from original page proofs, the book also might be a reprint. In such case, the entire book being reprinted is trimmed along its head and gutter margins at one time. This, of course, separates the pages.

Regardless, the first eight pages are taken to a conventional, direct-image, positive plate-making machine which has been modified according to the method of the invention. The machine which is used the preferred embodiment of the method is an Itek "Platemaster" unit. More specifically, the machine which is employed is a 20.24 Itek "Platemaster" Series machine. These machines are manufactured by itek Business Products, a division of ITEK CORPORATION OF ROCHESTER, New York. They are designed to make a direct image, positive plate from the material being reproduced.

Referring now to FIG. 1, in the present invention the flat bed 10 of an Itek Platemaster machine (shown only in part) is modified by fastening a "work holder" for "jig" 11 to it in a prescribed manner. The jig 11 is cut from cardboard sheet stock or the like approximately 0.010 inches thick. The jig 11 is in the shape of a cross and comprises a longitudinal leg 15 and a transverse leg 16, each of which is ½ inches wide in the present illustration.

A centerline 17 is inscribed in black ink, for example, along the entire length of each leg 15 and 16 of the jig 11. Then the undersurface of the cover glass 18 on the bed of the Itek machine is masked with conventional masking tape 19 in exactly the same shape and width as the jig 11, except that each of the legs 15a and 16a are terminated one-half inch (½ inch) short of the corresponding edge of the sheet of paper to be printed; i.e., a 12½ × 18½ sheet is used in the method of the present invention, so the legs 15a and 16a would be 11½ inches and 17½ inches long, respectively. The purpose of this relationship will hereinafter be discussed in detail.

The proofs of pages 1, 4, 5 and 8 are then positioned on the bed surface 10, in the manner illustrated in FIG. 3. Pages 1 and 5 are positioned with their upper left-hand corners adjacent the center of the jig 11 and pages 4 and 8 are positioned with their upper righthand corners adjacent the center of the jig.

With the jig 11 and tape 19 positioned as described, the same set-up is utilized regardless of the size of the book being made. Actually, the press utilized limits the maximum size of the book to 6 × 9 inches or any size less than 6 × 9 inches where the method is employed in its most efficient form. For example, 5½ × 8½ inches, 5 × 8 inches, or 4 × 7 inches books can be printed and bound according to the method of the invention without modifying the aforedescribed set-up of the positive plate-making machine.

The machine is actuated by the plate machine press operator (No. 1). It operates in a well-known manner to make a plate A containing pages 1, 4, 5 and 8.

While the initial plate A is automatically being made in the aforedescribed manner for pages 1, 4, 5 and 8 of the book to be printed, pages 2, 3, 6 and 7 are taken by operator No. 1 and trimmed in the aforedescribed manner. Plate A having been finished by this time, operator No. 1 positions pages 2, 3, 6 and 7 on the bed surface 10 against the jig 11 in the manner illustrated in FIG. 4. Pages 3 and 7 have their upper lefthand corners adjacent the center while pages 2 and 6 have their upper righthand corners so positioned. Plate B is made from these pages.

Plates A and B are then mounted by the operator on a "perfecting press" which has been modified according to the present invention. The press which is used in the preferred embodiment of the invention is the Davidson 700 Perfector Press, produced by American Type Founders Co., Inc. of Nashville, Tennessee. The unmodified press is conventionally used in commercial printing. FIG. 5 of the drawing diagrammatically illustrates the upper plate receiving drum 30 and the lower plate receiving drum 31. Inking and dampening rollers are also illustrated.

Referring now to FIGS. 6 and 7, portions of the upper drum 30 and lower drum 31 are illustrated in front elevation. The operator secures the plate B to the lower drum 31 first.

Extending across the face of the drum 31 at the upper edge of its plate receiving segments is a spring-loaded plate clamp 35B. The clamp 35B is inscribed with a mark 36B precisely on the centerline of the drum 31. The plate B has, of course, been made with a mark indicating its centerline by virtue of the center line 17 scribed on the jig 11, all but the outer edges of which have been obliterated on the plate B by the mask 19.

The gripper edge of the plate B; i.e., the free edge running along pages 2 and 3, is then inserted under the clamp 35B with its center line in registry with the center mark 36B scribed on the clamp. As illustrated, the free edge of the plate B then extends downwardly across the face of the drum 31.

In contrast the gripper edge of plate A, which runs along the free edges of pages 1 and 4, is inserted in a spring clamp 35A extending the width of the drum 30 on the lower edge of the drum segment which receives the plate segment A. A center mark 36A is inscribed on the clamp 35A so that the plate A can be centered precisely on the drum 30 relative to plate B. The center marks 36A and 36B are selected according to the method of the invention so that the plates A and B will be in precise registry with each other, on a transverse axis, on opposite sides of the sheets S produced by the press. The back surface of the plate A is moistened to cause it to adhere to the surface of the drum 30 since the uppper edge of the plate A, opposite the gripper edge, is free and would otherwise tend to fall down before the drum 30 began to rotate unless caused to adhere in the aforedescribed manner.

The press is then operated in a conventional manner to produce sheets S having four pages on each side. In a five hundred (500) book run, five hundred of these sheets containing pages 1 to 8 are printed, of course. Normally, 100 to 150 additional pages are also printed. Fifty of these pages can go into the ten percent (10%) overage which the customer would normally accept in this business. Since a printing machine of this type works at up to 8,000 impressions per hour and it is normally run in the present method at 6,000 impressions per hour, it will be seen that the entire printing process for each sheet can be accomplished in less than 10 minutes. The press is set in motion by operator No. 1 and he returns to plate making.

While the perfecting press is printing the aforedescribed pages 1–8 of the book, the operator makes two more plates. These are the plates for 9–16. They can be made in less time the ten minutes required to print pages 1–8. With this extra time, the operator is free to go back and check the operation of the press and printing quality. Pages 9–16 are arranged on the plates in a sequence corresponding to that of pages 1–8.

When the run of pages 1–8 has been finished, the operator turns to the perfecting press with the two new plates he has made for pages 9–16. The sheets S for pages 1–8 are removed by the operator and placed on a bindery skid. The skid remains adjacent the press operation until all the pages for a technical book, for example, have been printed.

The perfecting press is set up to print only one size sheet; i.e., a 12½ × 18½ inches sheet as has been pointed out. Actually the conventional machine has been modified to run this size sheet. The specifications on the machine from the Davidson Company indicate that it will run a sheet having a maximum size of 15 × 18 inches. The machine has been modified by the inventor to produce a 18½ inches maximum length.

The bindery skid with all of the sheets S containing all of the pages for a book is then taken to a folding machine by the folder-binder operator (No. 2). The folding machine used is a Cleveland ATC18 18 × 24 inches continuous feed machine manufactured by the Miehle-Gross-Dexter Company of Chicago, Illinois.

Referring now to FIG. 8, operator No. 2 utilizes the folding machine to fold each sheet S with two folds. The first fold is a fold transverse of the lengthwise dimension of each sheet S (and perpendicular to its gripper edge) at the mid-point of the sheet to establish the head margin for the book. Pages 4 and 5 then face up, while pages 1 and 8 face down.

The folded sheet S illustrated in FIG. 8 is then perforated, as at 40, on the center line of the sheet parallel to the gripper edge. This causes the folded sheet to lie flat in the pocket of a conventional Massey collator. It also establishes the spine and the gutter margin of the book. Then, a "cross-over" fold is made on the perforated spine to create a folded sheet with eight sections, page 1 being in front. In this regard, we are always dealing in the preferred form of this method in terms of eight pages on a single sheet S.

All of pages 1–8, each on a folded sheet S, 650 of them in the present illustration, are then banded together in a single "form". Operator No. 2 places the banded forms together on a skid.

These forms are then taken to the Massey collater by a collater-cutter operator (No. 3) and placed in pocket 1 of an eight pocket collater machine. The same is done with pages 9–16 in pocket 2, pages 17–24 in pocket 3, etc., up to pages 57–64 in pocket 8. The machine collates the pages so we end up with 64 page sections for each book. Five of these 64 page sections would make a 320 page book, for example.

According to the invention, as each section containing pages 1–64 is expelled by the collater, it is placed in one of the pockets P on the assembly rack 50 seen in FIGS. 9–11. The rack 50 comprises a rotary drum 51 mounted on a frame 52 which is supported by conventional rollers 53. The drum rotates on a shaft 55 and has 25 outer shafts 59 extending parallel to the shaft 55 and fastened to the drum adjacent its periphery. Mounted on each of these shafts 59 are 10 pockets P.

Referring to FIG. 11, each of the pockets P has a base 60 and two side walls 61 and 62. One edge of the base is cut out, as at 65. As the drum rotates, the pockets P rotate with the shafts 59 so that they always remain in an upright position, similar to a ferris wheel seat.

If the book being run is being done in 500 copies, as has been described here, two of these racks 50 would be utilized. The last 64 page section for each book would be positioned in a pocket P, in sequence. Eventually, 500 pockets; i.e., all of the pockets on both racks 50, would be filled with the last 64 page section. The same thing would then be done with the next to last 64 page section, putting one of them in each pocket P. Five such sections would make a 320 page book, as has been pointed out. Once all five sections were seated in the pockets P, a complete book (without the cover) would be present in each pocket, of course.

Operator No. 2 then wheels the racks 50 to a conventional Sulby Binder. The present invention utilizes a conventional binder of this type to bind the pages of the book and cover together. This is a semi-automatic binding operation. After the glue has dried, the books are stacked in twos or threes, or fives or sixes whatever thickness would make about 3 inches in height, and taken to a conventional Challenge cutter, where they are trimmed to size.

All of the aforedescribed work is accomplished by a single operator (No. 1) in the pressroom who makes the plates and runs the press. Two operators (Nos. 2 and 3) in the bindery run all the collating, binding and trimming equipment. Because of the manner in which the invention is programmed, the men are always busy and this reduces the cost of producing a book.

Equipment utilized in this method is considerably less expensive than the conventional printing equipment. As a result, the equipment needn't be operating continuously to achieve economical operation. More equipment can be utilized than men because the hourly cost of the machine is less than the hourly rate of the men.

The method is designed primarily for printing and binding 6 × 9 inches books. Because of the short run and the small amount of paper involved in any one book, however, books of a smaller size; i.e., 5½ × 8½ inches or 5 × 8 inches, or even 4 × 7 inches, as has been previously pointed out, can be printed using the same size paper and the same procedures, merely trimmed to a smaller size after binding. The extent of savings in labor and time far exceed the minor additional expense created by a certain amount of paper waste.

The quality of the books produced by this method is as high as the quality of the books printed by the conventional offset method.

Because of the nature of the press, where this method might use 25–30 sheets to get the ink and water balance on the press correct before getting usable sheets S, a conventional offset press has to run anywhere from 100 to 200 sheets to get the same thing. The present method thus results in a savings of paper used for a given book.

While the embodiment described herein is at present considered to be preferred, it is understood that various modifications and imporvements may be made therein, and it is intended to cover in the appended claims all such modifications and improvements as fall within the true spirit and scope of the invention.

What is desired to be claimed and secured by Letters Patent of the United States is:

1. A method of manufacturing bound books, comprising the steps of:
   a. selecting a sequence of eight pages of a book or page proofs thereof,
   b. taking the first, fourth, fifth and eighth of said pages and placing them in a work holder on the bed surface of a direct-image, positive plate-making machine wherein said work holder includes raised positioning means disposed perpendicular to and intersecting each other, said positioning means being effective to locate these four pages in a rectangle with the upper left corners of the first and fifth pages adjacent the center of the positioning means and the upper right corners of the fourth and eighth pages adjacent the center of said positioning means and also with the head and gutter margins of each page correctly spaced and aligned,
   c. making a direct image, positive plate (A) of said first, fourth, fifth and eighth pages,
   d. repeating the aforedescribed steps (b) and (c) with the seventh, sixth, third and second pages arranged in corresponding fashion to the first, fourth, fifth and eighth pages to make another direct-image, positive plate (B),
   e. positioning plate (A) on one of two drums of a perfecting press and plate (B) on the other of said two drums with the plates in alignment with each other on a vertical center line and with that vertical centerline in registration with a vertical alignment mark on said press,
   f. operating the press to produce a predetermined number of sheets S having four pages of the aforedescribed eight pages on each side thereof,
   g. repeating the aforedescribed plate-making and printing process with each additional sequence of eight pages making up a book,
   h. folding each sheet along one center line and then along the other perpendicular center line,
   i. collating the folded sheets and assembling a book from sheets containing all of the pages of each book, and
   j. binding and trimming the assembled book.

2. The method of claims 1 further characterized by and including the step of:
   a. establishing said positioning means on the bed of said direct image, positive plate-making machine so that it spaces the adjacent longitudinal edges of the pages a predetermined distance apart transversely of the rectangle and spaces the adjacent transverse head edges of the pages a predetermined distance apart longitudinally of said rectangle.

3. The method of claim 2 further characterized by and including the step of:
   a. inscribing a center line on said positioning means extending transversely of the positioning means at a point midway between the adjacent head edges of the pages when they are seated against said positioning means,
   b. inscribing a center line on said positioning means extending longitudinally of the positioning means at a point midway between the adjacent side edges of the pages when they are seated against said positioning means,
   c. whereby transverse and longitudinal center marks are formed on each plate made.

4. The method of claim 3 wherein the bed of the plate making machine has a cover glass which is movable from a position on said bed to a position off said bed, further characterized by and including the step of:
   a. masking the cover glass of said bed so that when it is brought down onto said bed and covers the positioning means and sheets arranged thereagainst it masks out all but the outermost portions of said inscribed center lines and only said portions are reproduced on a corresponding plate.

5. The method of claim 3 further characterized by and including the step of:
   a. inscribing corresponding center marks on the gripper clamps of the plate receiving drums in the perfecting press,
   b. positioning the plates on corresponding ones of said drums with the transverse center line mark of each plate in vertical alignment with said center marks on said gripper clamps and with a side edge of each of said plates gripped by a corresponding gripper clamp.

6. The method of claim 1 further characterized by and including the step of:
   a. prior to folding each sheet perforating said each sheet along its longitudinal center line so that when the second fold is made the folded sheet lies substantially flat.

\* \* \* \* \*

UNITED STATES PATENT AND TRADEMARK OFFICE
CERTIFICATE OF CORRECTION

PATENT NO. : 3,982,743
DATED : September 28, 1976
INVENTOR(S) : Paul W. DeRoo, Sr.

It is certified that error appears in the above-identified patent and that said Letters Patent are hereby corrected as shown below:

Column 2 line 34 after "used" insert -- in --

Column 2 line 39 change "itek" to -- Itek --

Column 4 line 21 after "for" insert -- pages --

Column 4 line 22 after "time" insert -- than --

Column 4 line 47 change "Gross" to -- Goss --

Column 6 line 13 change "imporvements" to -- improvements --

Signed and Sealed this

Eighth Day of November 19

[SEAL]

Attest:

RUTH C. MASON
Attesting Officer

LUTRELLE F. PARKER
Acting Commissioner of Patents and Trademai